United States Patent
Kim et al.

(10) Patent No.: US 7,539,073 B2
(45) Date of Patent: May 26, 2009

(54) MEMORY DEVICE WITH AUXILIARY PRECHARGE UNIT TO IMPROVE PRECHARGE OPERATION FOR BIT LINE CIRCUITRY

(75) Inventors: Dong-Keun Kim, Ichon-shi (KR); Chang-Ho Do, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 990 days.

(21) Appl. No.: 10/877,880

(22) Filed: Jun. 25, 2004

(65) Prior Publication Data

US 2005/0248672 A1   Nov. 10, 2005

(30) Foreign Application Priority Data

May 6, 2004   (KR) .................. 10-2004-0031926

(51) Int. Cl.
*G11C 7/00* (2006.01)
(52) U.S. Cl. .................. 365/203; 365/202
(58) Field of Classification Search ............... 365/202, 365/203, 204, 205
See application file for complete search history.

(56) References Cited

U.S. PATENT DOCUMENTS

| | | | | |
|---|---|---|---|---|
| 4,823,319 A | * | 4/1989 | Pfennings | 365/189.09 |
| 5,321,657 A | * | 6/1994 | Arimoto et al. | 365/203 |
| 6,480,434 B1 | * | 11/2002 | Lee | 365/203 |

* cited by examiner

*Primary Examiner*—Pho M. Luu
*Assistant Examiner*—Alexander Sofocleous
(74) *Attorney, Agent, or Firm*—Blakely, Sokoloff, Taylor & Zafman LLP (57) ABSTRACT

A semiconductor memory device having a shared bit line sense amplifier structure is provided. The semiconductor memory device includes: a plurality of cell arrays each of which has a plurality of bit line pairs, in which the cell arrays includes a first cell array disposed at an edge portion of a cell region and a second cell array disposed adjacent to the first cell array; a first precharging unit for precharging some bit line pairs of the first or second cell array; a second precharging unit for precharging the other bit line pairs of the first cell array; and an auxiliary precharging unit for assisting a precharge operation of the second precharging unit.

6 Claims, 10 Drawing Sheets

MEMORY DEVICE WITH AUXILIARY PRECHARGE UNIT TO IMPROVE PRECHARGE OPERATION FOR BIT LINE CIRCUITRY

FIELD OF THE INVENTION

The present invention relates to a semiconductor memory device; and, more particularly, to a semiconductor memory device having a shared bit line sense amplifier structure.

DESCRIPTION OF THE PRIOR ART

Figure 1:
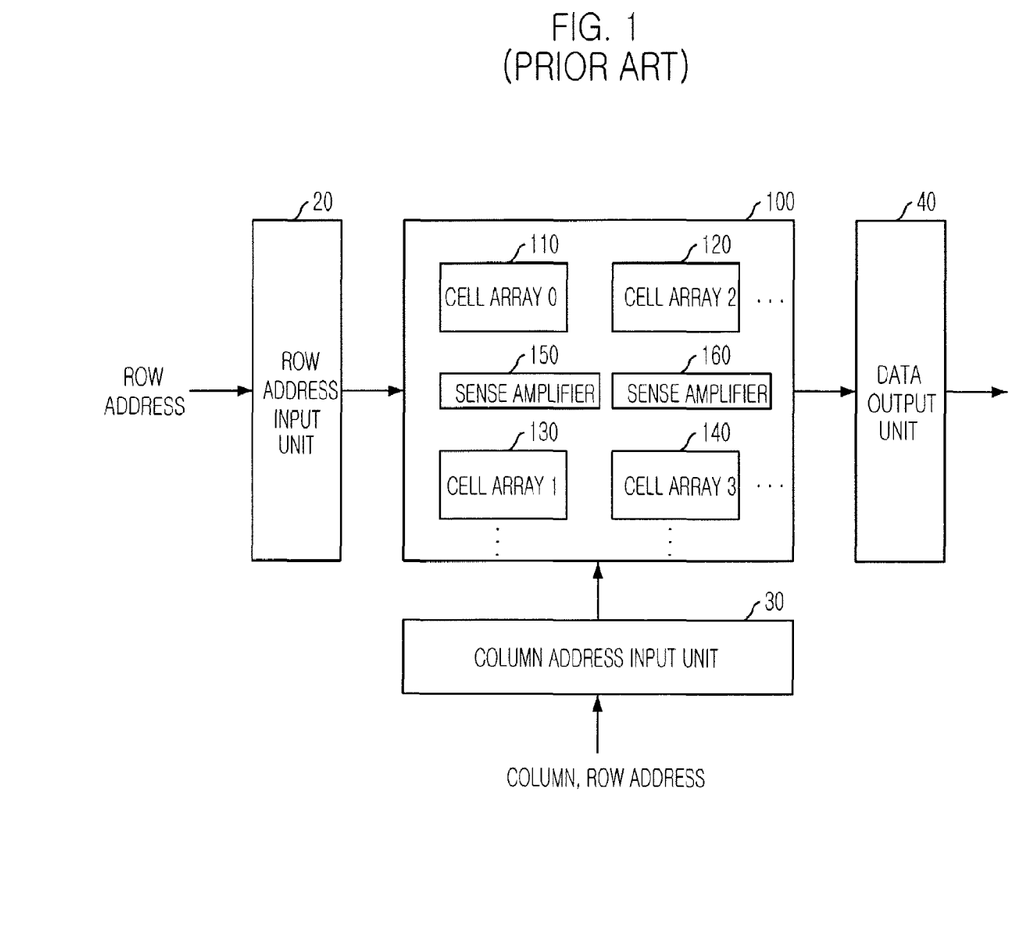
FIG. 1 is a block diagram of a conventional semiconductor memory device.

FIG. 1 is a block diagram of a conventional semiconductor memory device.

Referring to FIG. 1, a conventional semiconductor memory device includes a row address input unit 20 for decoding a row address; a column address input unit 30 for decoding a column address; a cell region 100 including a plurality of cell arrays 110, 120, 130 and 140, each of which includes a plurality of unit cells, for outputting data corresponding to a signal from the row address input unit 20 and the column address input unit 30; and a data output unit 40 for outputting data from the cell region 100 to an exterior.

Meanwhile, the cell region 100 includes bit line sense amplifiers 150 and 160 for amplifying the data signal outputted from the cell arrays 110, 120, 130 and 140 to output the amplified data signal to the data output unit 40.

Figure 2:
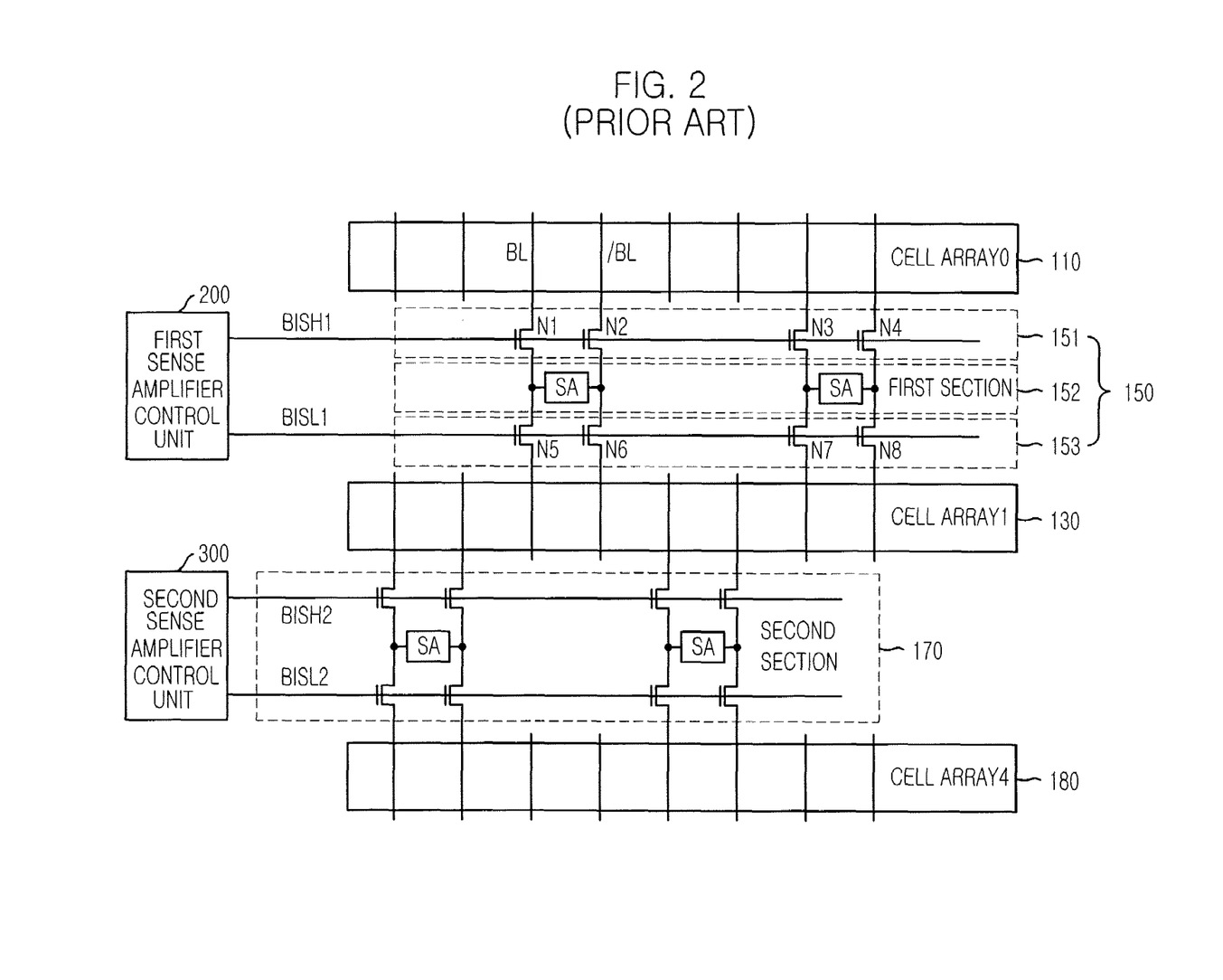
FIG. 2 is a block diagram of a cell region having a shared bit line structure.

FIG. 2 is a block diagram of the cell region having a shared bit line sense amplifier structure.

Referring to FIG. 2, the cell region 100 includes a plurality of cell arrays 110, 130 and 180, in which a plurality of unit cells are arrayed (generally, one unit cell consists of one capacitor and one transistor). The cell arrays 110, 130 and 180 include bit lines BL and /BL on which the data signal stored in unit cell selected among the plurality of cell arrays is applied, and bit line sense amplifiers 150 and 170 for sensing and amplifying the signal applied on the bit lines BL and /BL.

Further, the cell arrays 110, 130 and 180 include first and second bit line sense amplifier controlling units 200 and 300 for outputting first and second connection signals BISH and BISL for connecting and disconnecting the bit line sense amplifier 150 and 170 from the cell arrays 110, 130 and 180.

Figure 3:
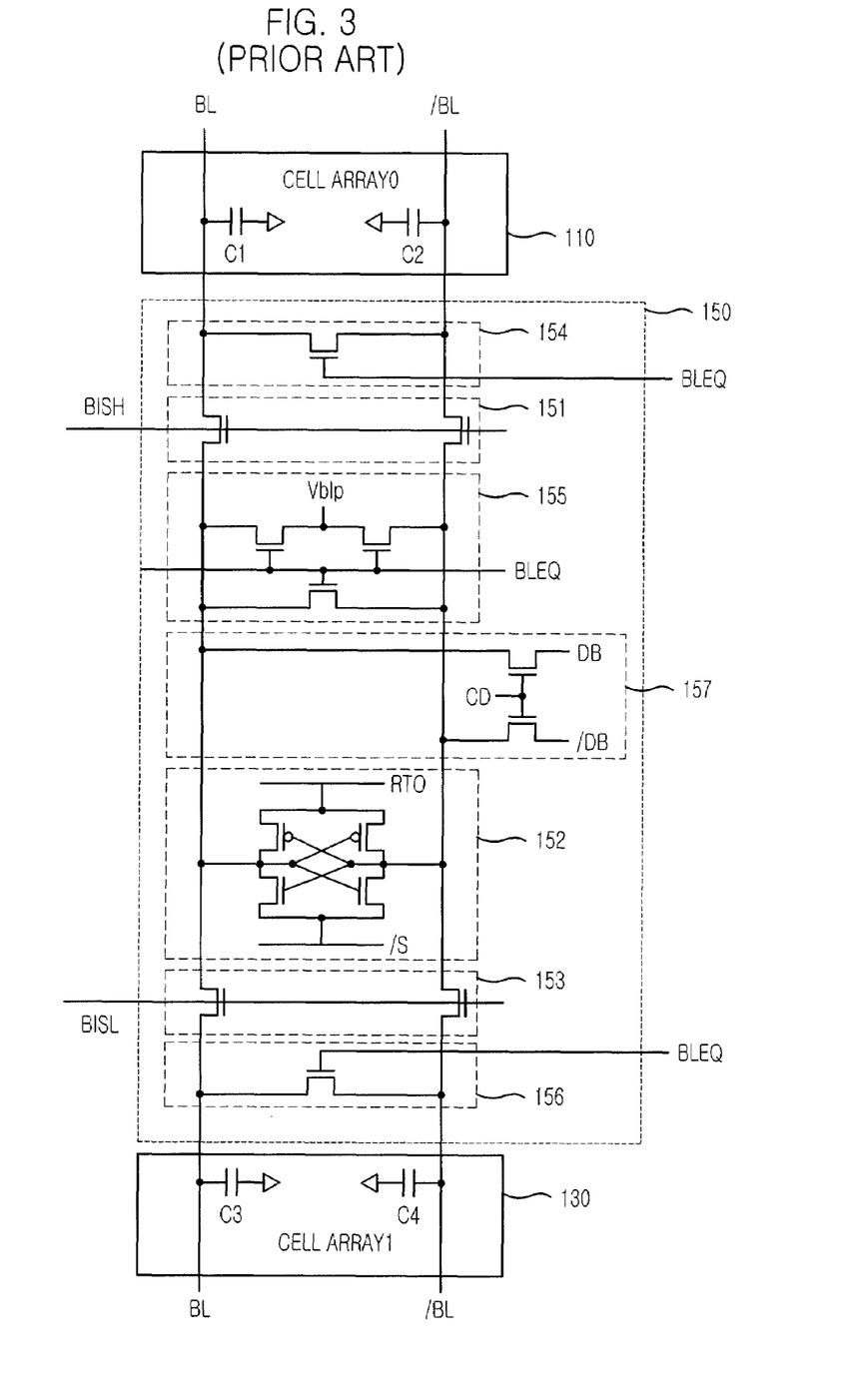
FIG. 3 is a detailed circuit diagram of a bit line sense amplifier shown in FIG. 2.

FIG. 3 is a detailed circuit diagram of the bit line sense amplifier shown in FIG. 2.

Referring to FIG. 3, the bit line sense amplifier 150 includes: a bit line sense amplifier unit 152 enabled in response to bit line sense amplifier enable signals RTO and /S to amplify a signal difference of the bit lines BL and /BL; a precharging unit 155 enabled in response to a precharge enable signal BLEQ, which is outputted when the bit line sense amplifier unit 152 is enabled, for precharging the bit lines BL and /BL by a bit line precharge signal Vblp and making the bit lines BL and /BL to have the same voltage level in response to the equalization signal BLEQ; a first equalization unit 154 for equalizing the bit lines BL and /BL connected to the cell array 0 110 by the equalization signal BLEQ; a second equalization unit 156 for equalizing the bit lines BL and /BL connected to the cell array 1 130 by the equalization signal BLEQ; an output unit 157 for outputting the data signal amplified by the bit line sense amplifier unit 152 in response to a column control signal CD, which is generated by the column address; and connection controlling units 151 and 153 for connecting and disconnecting the bit line sense amplifier 150 from the cell array 0 110 and the cell array 1 130 in response to the first and second connection signals BISH and BISL.

Here, each of capacitors C1 to C4 includes the unit cell and metal wire of the cell array 0 110 and the cell array 1 130 and represents a load capacitance applied from the bit lines BL and /BL.

Hereinafter, an operation of the bit line sense amplifier of the semiconductor memory device will be described with reference to FIGS. 1 to 3.

In case of earlier memory devices, one bit line sense amplifier is provided at each cell array to sense and amplify data applied from the cell array to the bit line. However, in case of current memory devices, one bit line sense amplifier 150 is provided at every second cell array 110 and 130 for high integration of the memory device. Also, NMOS switches 151 and 153 controlled in response to the connection signals BISH and BISL are provided and used for an operation of amplifying cell data of the cell array 0 110 and the cell array 1 130. This structure is called a shared bit line sense amplifier structure.

In a precharge operation, the first and second connection signals BISH and BISL are connected in an enabled state of a high level. If the cell array 0 110 is selected in an active operation, the second connection signal BISL is applied in a disabled state of a low level. If the cell array 1 130 is selected, the first connection signal BISH is applied in a disabled state of a low level.

For example, if the cell array 0 110 and the bit line sense amplifier 150 are connected with each other, one unit cell of the cell array 0 110 is selected by the inputted address, and data signal of the selected unit cell is applied to the bit lines BL and /BL, which are precharged to half a power supply voltage.

Next, the bit line sense amplifier 153 senses and amplifies the data signal applied on the bit line and outputs the amplified signal through the output unit 157 to the data line. The data outputted to the data line is outputted to an external circuit through the output unit 157.

After the data is outputted, the equalization signal BLEQ is inputted in the enabled state to precharge the bit lines BL and /BL to half a power supply voltage. In detail, the two bit lines BL and /BL are set to the same voltage level by the equalization signal BLEQ, and the bit lines BL and /BL are precharged to half the power supply voltage level by the bit line precharge voltage Vblp.

Since the two cell arrays share one bit line sense amplifier in the shared bit line sense amplifier structure, the unshared bit line sense amplifiers always occur at one side of the cell arrays provided at edge portions.

The cell region has the plurality of cell arrays. At the cell arrays provided at one edge portion and the other edge portion, the unshared bit line sense amplifiers always occur.

Figure 4A:
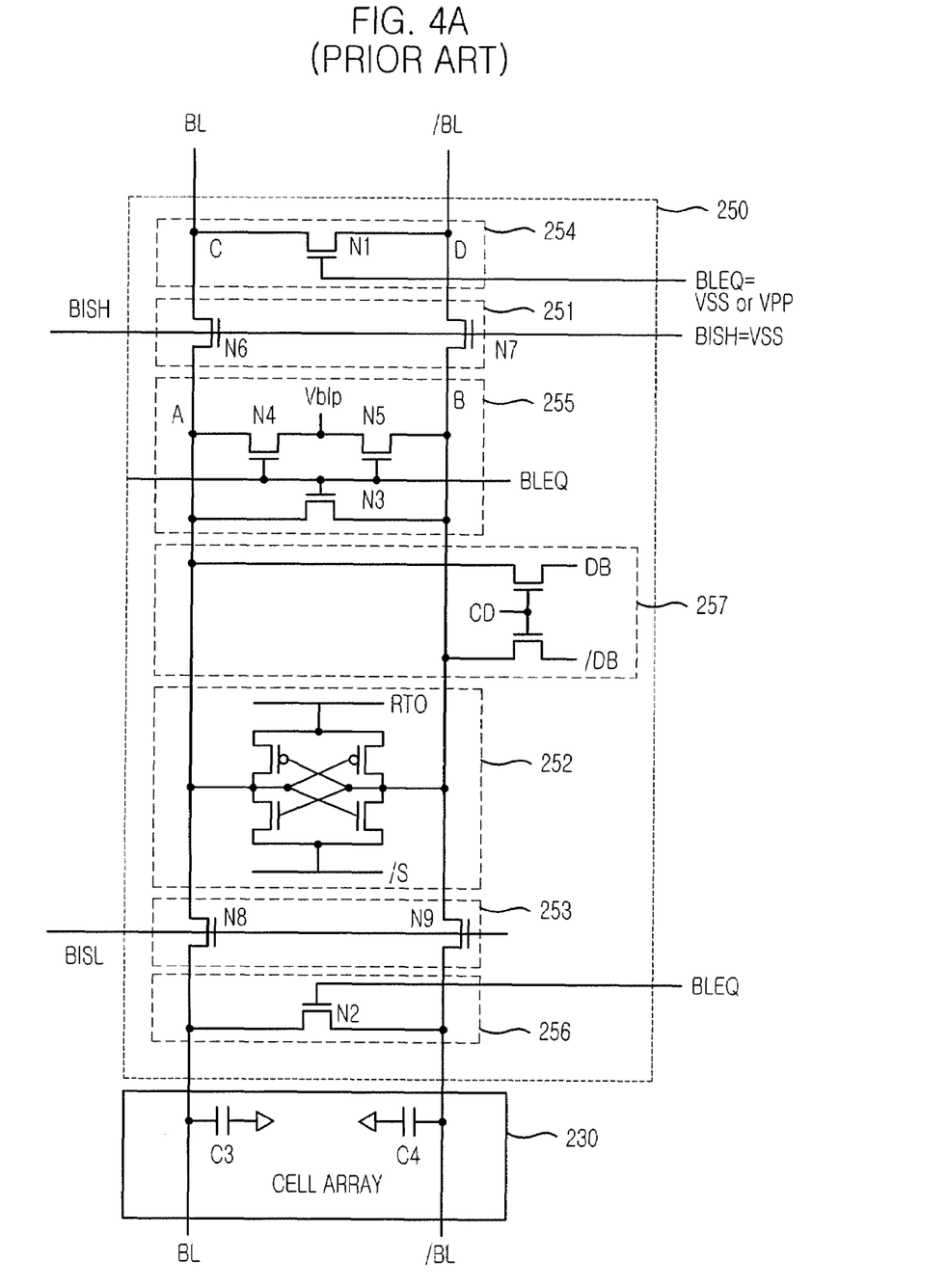
FIG. 4A is a circuit diagram of a bit line sense amplifier disposed at an edge of a cell region.

FIG. 4A is a circuit diagram of the bit line sense amplifier disposed at the edge portion of the cell region.

Referring to FIG. 4A, a bit line sense amplifier 250 disposed at the edge portion of the cell region has the same configuration as a bit line sense amplifier disposed at other locations.

However, the bit line sense amplifier 250 disposed at the edge portion is connected with the cell array only at one side. Therefore, a connection controlling unit 251 disposed at the other side of the bit line sense amplifier 250 is maintained in the disabled state, and the equalization signal BLEQ applied to the equalization unit 254 is maintained at a high level or at a low level.

That is, the equalization signal BLEQ is applied to the equalization unit 254 in the disabled state of a low level or in an enabled state of a high level. The connection signal BISH is applied to the connection-controlling unit 251 in the disabled state of a low level.

Figure 4B:
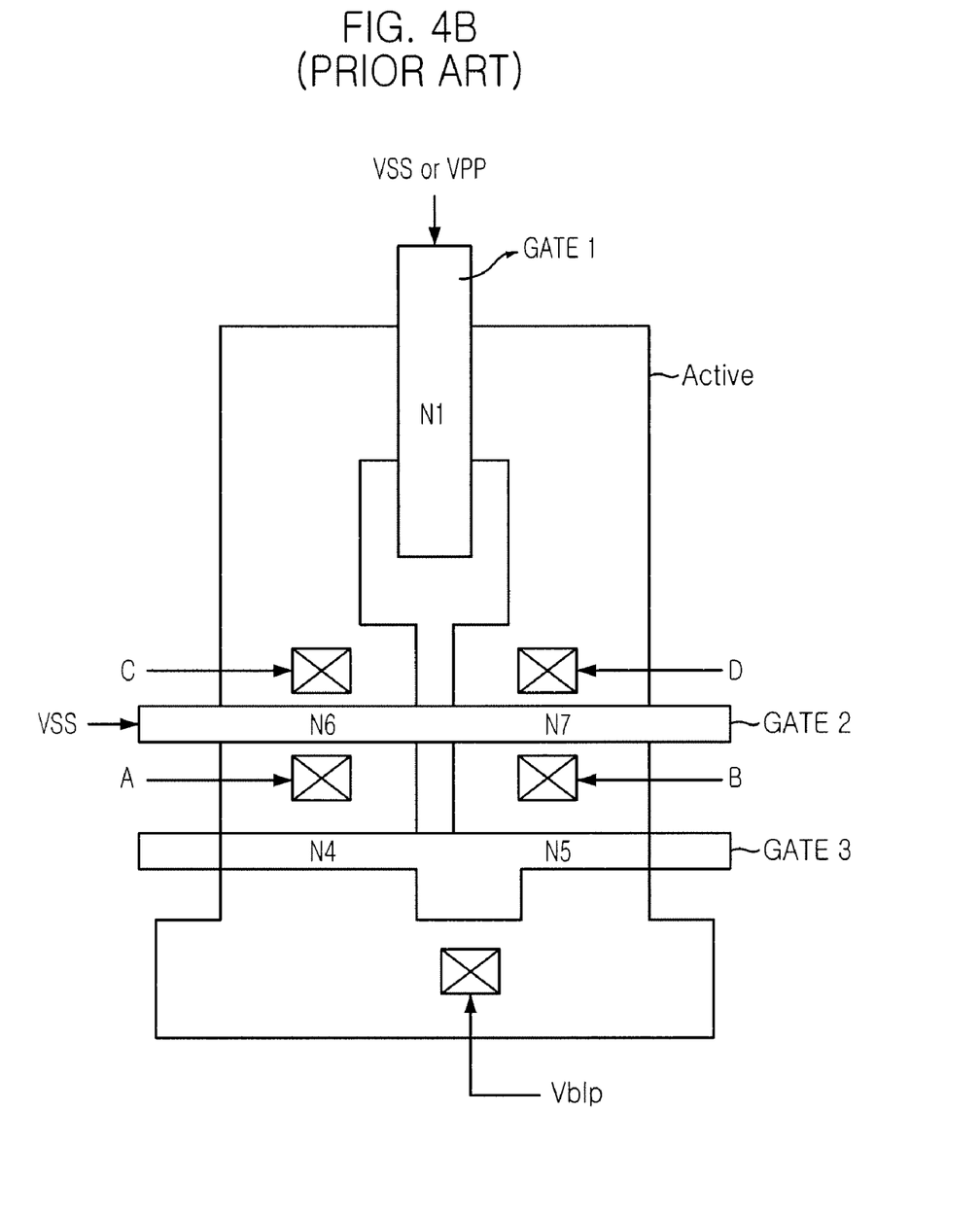
FIG. 4B is a layout illustrating a portion of a bit line sense amplifier of FIG. 4A.

FIG. 4B is a layout illustrating a portion of the bit line sense amplifier of FIG. 4A.

Each node of FIG. 4B denotes each node A, B, C and D of FIG. 4A. In FIG. 4B, there is shown a layout of five MOS transistors.

A MOS transistor N1 constructs the equalization unit 254, which is not used in FIG. 4A. MOS transistors N6 and N7 construct the connection controlling unit 251 which always maintain a disabled state. Also, MOS transistors N4 and N5 construct the precharging unit 255. Accordingly, in the layout of FIG. 4B, a ground voltage VSS is always supplied to gates (polyl) of the MOS transistors N6 and N7.

The bit line sense amplifier 250 performs the precharge operation only through two equalization units and one precharging unit, whereas the bit line sense amplifier 250 disposed at the edge performs the precharge operation through one equalization unit and precharging unit.

The bit line sense amplifier, which is connected with the cell array at the one side and the other side thereof, performs the precharge operation through the precharging unit and then is assisted for the precharge operation by the equalization units disposed at one side and the other side.

Referring to FIG. 3A, if the cell array 0 110 and the bit line sense amplifier 150 in operation are connected with each other, the bit lines BL and /BL connected to the cell array 1 130 are in such a state that it is precharged to half the power supply voltage.

Here, the precharge operation is initiated by the precharging unit 155 of the bit line sense amplifier 150 and the connection controlling unit 153 is enabled at the same time, such that the bit lines BL and /BL of the cell array 0 110 are assisted to be precharged by the equalization unit 156 from the bit lines BL and /BL of the cell arrayl 130, which are precharged to half the power supply voltage.

However, since the precharging unit 255 of the bit line sense amplifier 250 is connected to the cell array only at one side of the bit line sense amplifier 250, the precharging unit 255 is not assisted from the other side bit line in the precharge operation.

Generally, the bit line disposed in the cell array has a very larger capacitance than the bit line disposed within the bit line sense amplifier. Accordingly, it takes a longer time for the precharging unit 255 to perform the precharge operation when it assists the precharge operation than when it does not assist the precharge operation from the bit line disposed at an adjacent cell array.

Accordingly, it takes a longer time when the precharging unit 255 of the bit line sense amplifier 250 disposed at the edge performs the precharge operation than when the precharging unit 255 of the bit line sense amplifier 250 disposed at other locations performs the precharge operation. For the stability of the overall operation, a precharge time should be adapted to the bit line sense amplifier disposed at the edge portion, or the increasing of the precharge time should be tolerated in case where the bit line sense amplifier disposed at the edge is selected.

For this reason, the conventional memory device has a drawback in that an overall operation performance is greatly deteriorated.

SUMMARY OF THE INVENTION

It is, therefore, an object of the present invention to provide a semiconductor memory device having a shared bit line sense amplifier structure, which is capable of improving a precharge performance of a bit line sense amplifier disposed at an edge of a cell region.

In accordance with one aspect of the present invention, there is provided a semiconductor memory device having a shared bit line sense amplifier structure, comprising: a plurality of cell arrays each of which has a plurality of bit line pairs, the cell arrays including a first cell array disposed at an edge portion of a cell region and a second cell array disposed adjacent to the first cell array; a first precharging unit for precharging some bit line pairs of the first or second cell array; a second precharging unit for precharging the other bit line pairs of the first cell array; and an auxiliary precharging unit for assisting a precharge operation of the second precharging unit.

In accordance with another aspect of the present invention, a semiconductor memory device having a shared bit line sense amplifier comprises: a first cell array disposed at an edge portion among a plurality of cell arrays, each of which has a plurality of bit line pairs; a second cell array disposed adjacent to the first cell array; a first bit line circuit for precharging some bit line pairs of the first or second cell array or sensing and amplifying an applied data signal; and a second bit line circuit for sensing and amplifying data applied on the other bit line pairs of the first cell array or precharging the bit line pairs, wherein the second bit line circuit comprises: a first equalization unit for electrically connecting a first bit line pair of the first cell array in response to an equalization signal; a bit line sense amplifier for sensing and amplifying a data signal applied on the first bit line pair; a precharging unit for precharging the first bit line pair; a first connecting unit for connecting the first equalization unit with the bit line sense amplifier; a second equalization unit for electrically connecting the first bit line pair with each other in response to the equalization signal; and a second connecting unit for connecting the second equalization unit with the precharging unit, in which the second connecting unit is maintained in an enabled state.

In accordance with further another aspect of the present invention, a semiconductor memory device having a shared bit line sense amplifier structure comprises: a first cell array disposed at an edge portion among a plurality of cell arrays, each of which has a plurality of bit line pairs; a second cell array disposed adjacent to the first cell array; a first bit line circuit for precharging some bit line pairs of the first or second cell array or sensing and amplifying an applied data signal; and a second bit line circuit for sensing and amplifying data applied on the other bit line pairs of the first cell array or precharging the bit line pairs, wherein the second bit line circuit comprises: a first equalization unit for electrically connecting a first bit line pair of the first cell array in response to an equalization signal; a bit line sense amplifier for sensing and amplifying a data signal applied on the first bit line pair; a precharging unit for precharging the first bit line pair to a precharge voltage; a first connecting unit for connecting the first equalization unit with the bit line sense amplifier; a second equalization unit for electrically connecting the first bit line pair with each other in response to the equalization signal; and a second connecting unit for connecting the second equalization unit with the precharging unit, in which the precharge voltage is supplied to the first bit line pair connected with each other by the second equalization unit.

In accordance with still further another aspect of the present invention, a semiconductor memory device having a shared bit line sense amplifier comprises: a first cell array disposed at an edge portion among a plurality of cell arrays, each of which has a plurality of bit line pairs; a second cell array disposed adjacent to the first cell array; a first bit line circuit for precharging some bit line pairs of the first or second cell array or sensing and amplifying an applied data signal; and a second bit line circuit for sensing and amplifying data applied on the other bit line pairs of the first cell array or precharging the bit line pairs, wherein the second bit line circuit comprises: a first equalization unit for electrically connecting a first bit line pair of the first cell array in response to an equalization signal; a bit line sense amplifier for sensing and amplifying a data signal applied on the first bit line pair; a precharging unit for precharging the first bit line pair to a precharge voltage; a first connecting unit for connecting the first equalization unit with the bit line sense amplifier; a second equalization unit for electrically connecting the first bit line pair with each other in response to the equalization signal; a second connecting unit for connecting the second equalization unit with the precharging unit; and a metal wire for connecting the second equalization unit with the precharge unit regardless of an enabling of the second connecting unit.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 5:
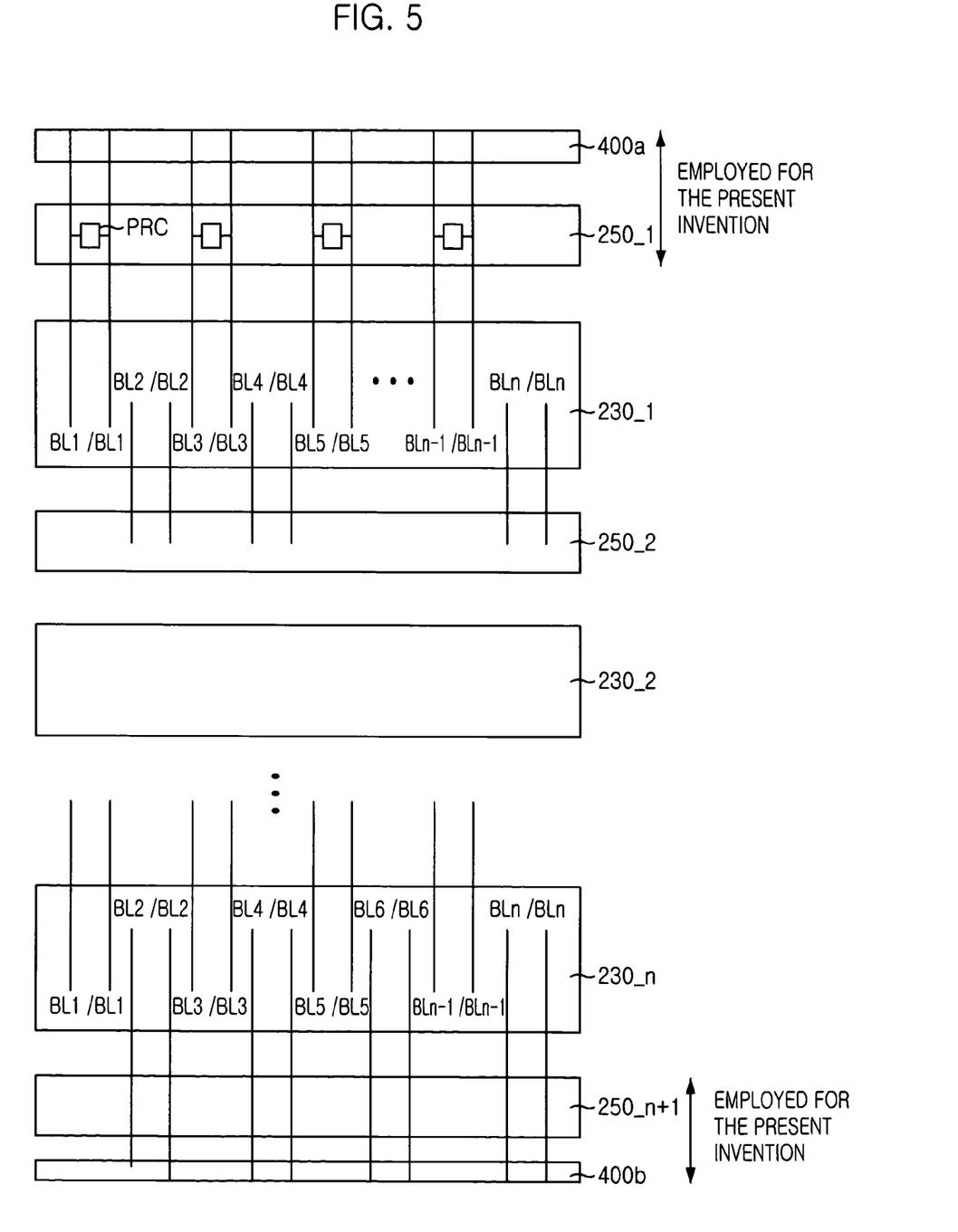
FIG. 5 is a block diagram of a semiconductor memory device in accordance with the present invention.

FIG. 5 is a block diagram of a semiconductor memory device in accordance with the present invention.

Referring to FIG. 5, a semiconductor memory device having a shared bit line sense amplifier structure in accordance with the present invention includes: cell arrays 230_1 and 230_n arrayed at an edge portion of a cell region among a plurality of cell arrays 230_1 to 230_n, each of which has a plurality of bit line pairs (BL and /BL); a cell array 230_2 arrayed adjacent to the cell array 230_1; a precharging unit 250_2 for precharging some bit line pairs provided in the cell array 230_1 or precharging some bit line pairs provided in the cell array 230_2; a precharging unit 250_1 for precharging the remaining bit line pairs provided in the cell array 230_1; and auxiliary precharging units 400a and 400b for assisting a precharge operation of the precharging unit 250_1.

Since the semiconductor memory device of the present invention has the shared bit line sense amplifier structure, one precharging unit is provided every second cell array.

However, the precharging unit 250_1 disposed at the edge portion of the cell region precharges the bit line pairs of the cell array 230_1. Further, the precharging unit 250_n+1 also precharges the bit line pair of the cell array 230_n.

Although the precharging unit is disposed between the cell arrays in order to precharge the bit line pair, a circuit (that is, a precharging circuit) disposed between the cell arrays functions not only to precharge the connected bit line pairs but also to sense and amplify a data signal applied on the bit line pairs.

As shown in FIG. 5, an essential structure of the present invention is the auxiliary precharging unit 400a for assisting the precharge operation of the precharging unit 250_1, which precharges some bit line pairs BL1 and /BL1, BL3 and /BL3, BL5 and /BL5, . . . , and BLn-1 and /BLn-1 of the cell array disposed at the edge portion of the cell region. The auxiliary precharging unit 400b also performs the same function as the auxiliary precharging unit 400a.

The precharge time of some bit lines BL1, /BL1, BL3, /BL3, BL5, /BL5, . . . , BLn-1, /BLn-1 of the cell array disposed at the edge portion is much more increased than that of the bit line of the cell array disposed at other locations. This causes the semiconductor memory device to operate at a very slow speed. In order to improve this, the present invention provides the auxiliary precharging unit 400a for assisting the precharge operation of the some bit lines of the cell array disposed at the edge portion.

Figure 6A:
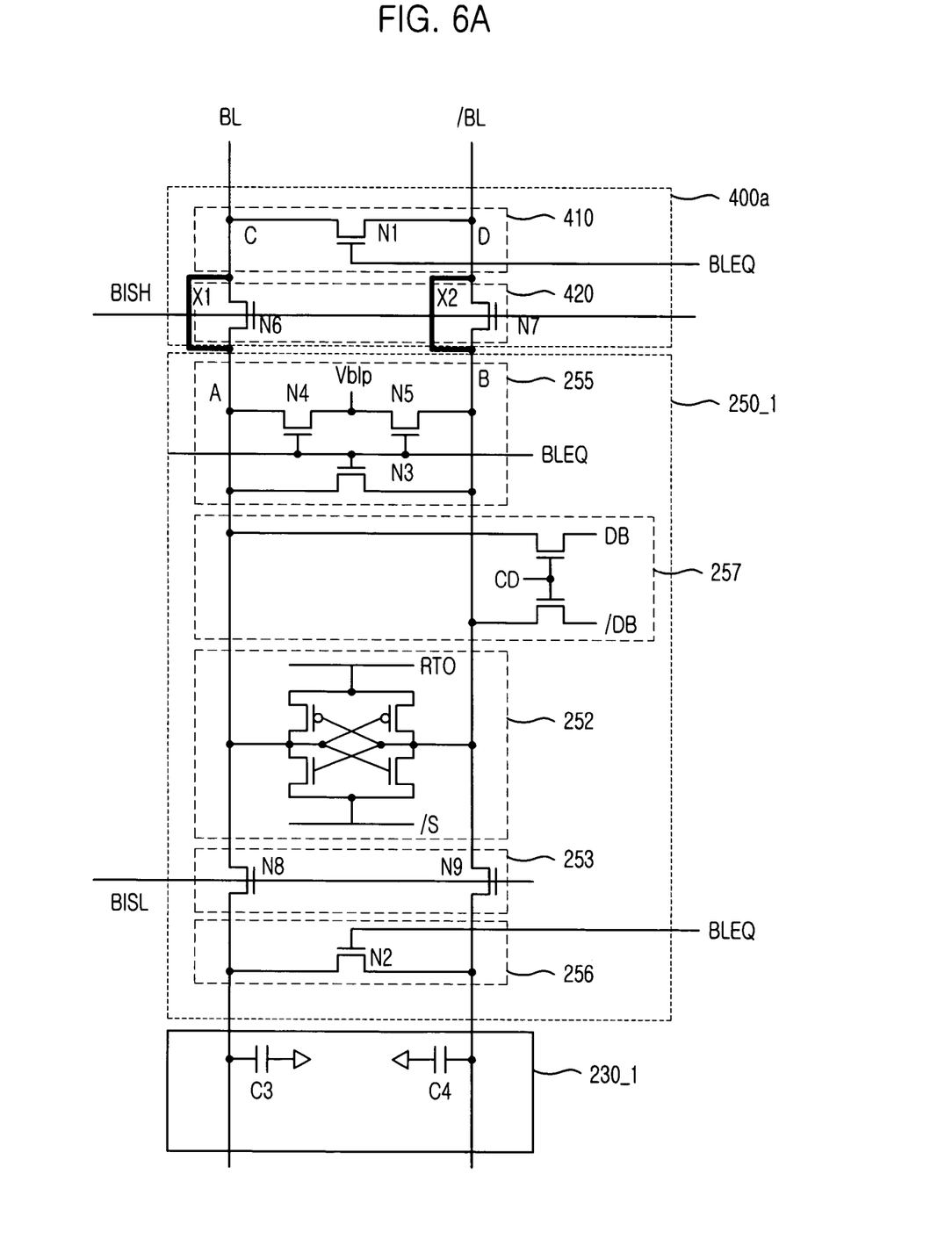
FIG. 6A is a circuit diagram of a semiconductor memory device in accordance with a first embodiment of the present invention.

FIG. 6A is a circuit diagram of the semiconductor memory device in accordance with a first embodiment of the present invention, showing the precharge operation and the sense amplification operation of the bit line disposed at the edge portion.

Referring to FIG. 6A, the bit line circuit 400a of the cell array disposed at the edge portion includes the equalization unit 256 for electrically connecting the bit line pairs BL1 and /BL1 provided at the cell array 230_1 in response to an equalization signal BLEQ; a bit line sense amplifier 252 for sensing and amplifying a data signal applied on the bit line pairs BL1 and /BL1; a precharging unit 255 for precharging the bit line pairs BL1 and /BL1; and a connecting unit 253 for connecting the equalization unit 256 with the bit line sense amplifier 252.

Also, the auxiliary precharging unit 400a for assisting the precharge operation in the bit line circuit 400a includes an equalization unit 410 for electrically connecting the bit line pair BL and /BL with each other in response to the equalization signal BLEQ; and a connecting unit 420 for connecting the equalization unit 410 with the precharging unit 255.

Here, the equalization unit 410 includes a MOS transistor N1 for connecting a node C with a node D in response to the equalization signal BLEQ.

The connecting unit 420 includes a MOS transistor N6 for connecting the node C with a node A in response to a connection signal BISH, which is always inputted in an enabled state; and a MOS transistor N7 for connecting the node D with a node B in response to the connection signal BISH. Each source and drain of the MOS transistors N6 and N7 are connected with each other through metal wires. Then, the connecting unit 420 of the auxiliary precharging unit 400a are maintained in a turned-on state, and the MOS transistor N1 of the equalization unit 410 receives the equalization signal BLEQ to assist the precharge operation in the bit lines BL and /BL of the bit line circuit 250_1.

Accordingly, unlike a conventional art in which the bit line circuit 250_1 corresponding to the cell array disposed at the edge uses only the precharging unit 155 and the equalization signal BLEQ to perform the bit line precharge operation, the bit line circuit 250_1 of the semiconductor memory device uses the auxiliary precharging unit 400a, in addition to the precharing unit 255 and the equalization signal BLEQ to perform the precharge operation. Therefore, the present invention greatly improves the precharge operation of the bit line circuit 250_1.

Here, the MOS transistors N6 and N7 forming the connecting unit are maintained in the turned-on state, such that the equalization unit 410 of the auxiliary precharging unit 400a assists more smoothly the precharge operation in the bit line circuit 250_1. Further, this embodiment provides the metal wire to directly connect electrically the source and the drain of the MOS transistors N6 and N7 so as to maximize a function of the equalization unit 410.

Figure 6B:
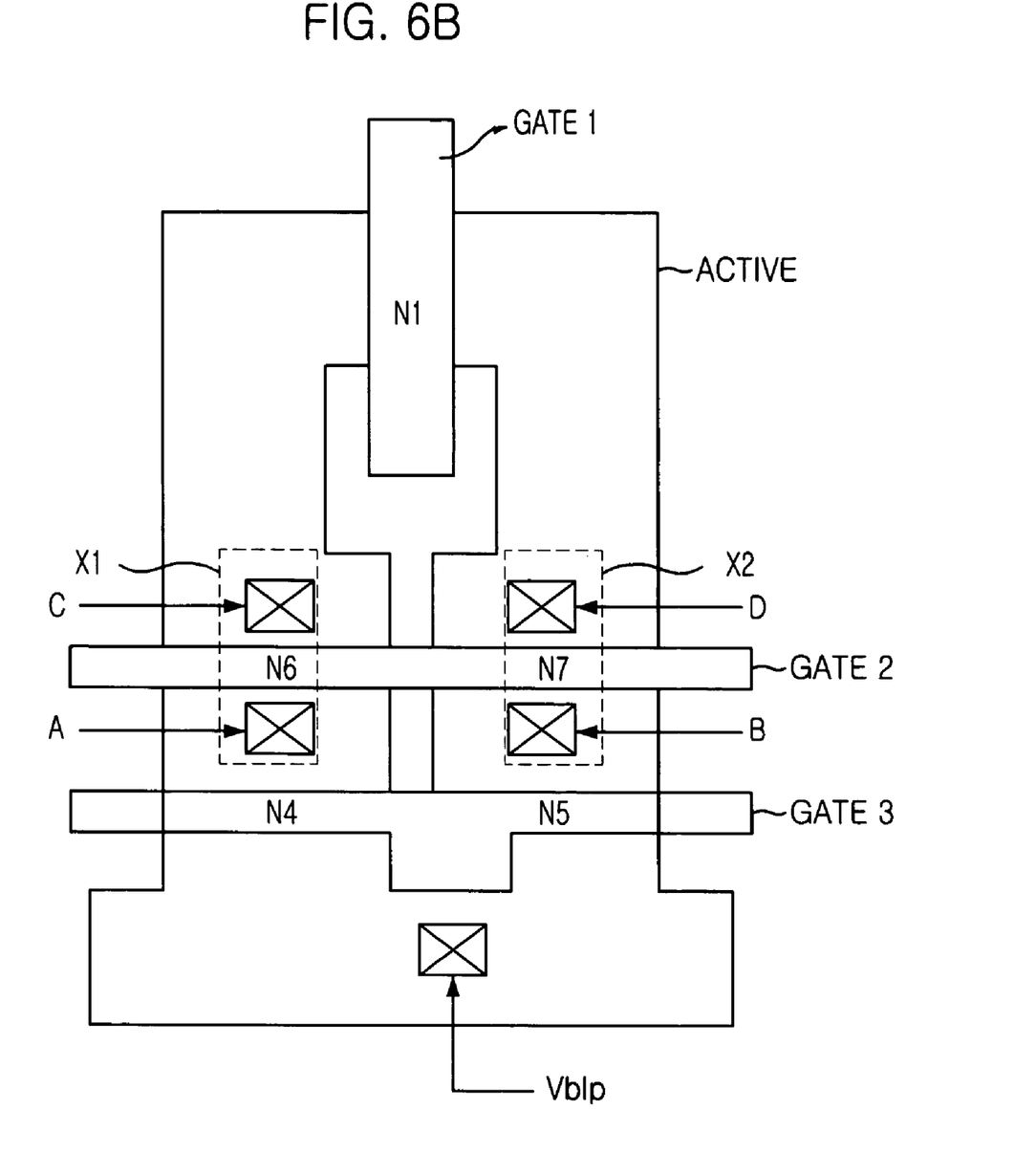
FIG. 6B is a layout illustrating a portion of a bit line sense amplifier of FIG. 6A.

FIG. 6B is a layout illustrating a portion of the bit line sense amplifier of FIG. 6A, in which the metal wires X1 and X2 electrically connect the source and the drain of the MOS transistors N6 and N7.

The nodes A, B, C and D of FIG. 6B are the same part as the nodes of FIG. 6A. Specifically, the nodes represent the MOS transistors N1, N4, N5, N6 and N7, respectively.

Due to the metal wires X1 and X2, the nodes C and A and the nodes D and B are respectively connected with each other to have a very low electrical resistance regardless of the MOS transistors N6 and N7. Accordingly, a role of the equalization unit 410 of the auxiliary precharging unit 400a can be increased.

Figure 7A:
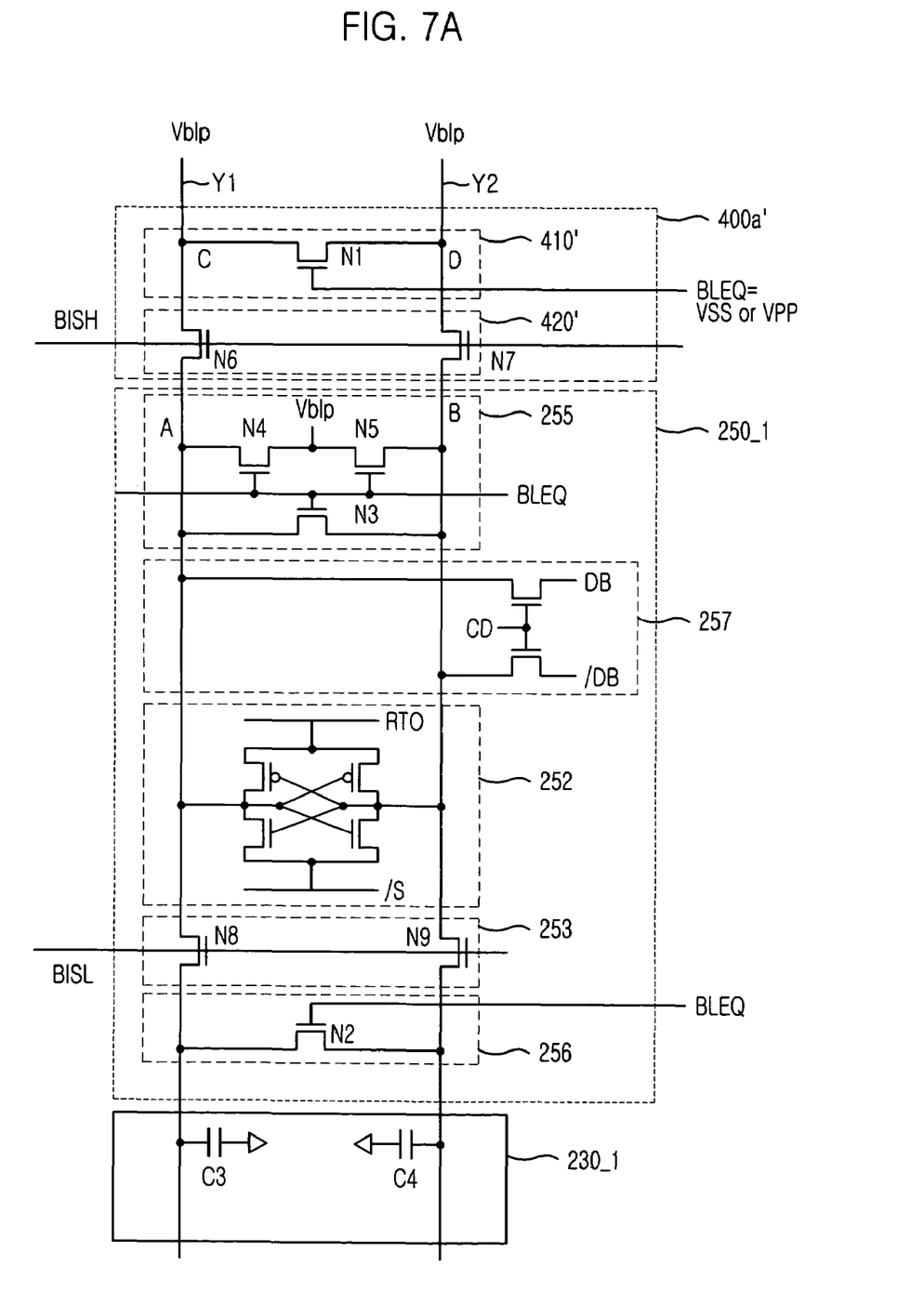
FIG. 7A is a circuit diagram of a semiconductor memory device in accordance with a second embodiment of the present invention.

FIG. 7A is a circuit diagram of a semiconductor memory device in accordance with a second embodiment of the present invention, showing the precharge operation and the sensing and amplifying operation of the bit line of the cell array disposed at the edge portion.

The bit line circuit 250_1 of FIG. 7A has the same construction as the bit line circuit 250_1 of FIG. 6A.

The auxiliary precharging unit 400a' includes an equalization unit 410' for electrically connecting a bit line pair BL and /BL in response to an equalization signal BLEQ, and a connecting unit 420' for connecting the equalization unit 410' with the precharging unit 255.

Herein, the connecting unit 420' includes a MOS transistor N6 for connecting a node C with a node A in response to a connection signal BISH, and a MOS transistor N7 for connecting a node D with a node B in response to the connection signal BISH.

Further, the equalization unit 410' includes a MOS transistor N1 for connecting the node C with the node D in response to the equalization signal BLEQ. The connecting unit 420' of the auxiliary precharging unit 400a' connects the node C with the node A, and the node D with the node B.

A great characteristic of the auxiliary precharging unit 400a' of the semiconductor memory device in accordance with the second embodiment of the present invention is to supply the precharge voltage Vblp to the node C and the node D.

In the precharging operation of precharging the bit lines of the bit line circuit 250_1, the auxiliary precharging unit 400a' supplies a precharge voltage Vblp from the nodes C and D to the bit line circuit 250_1, thereby greatly improving a speed of the precharge operation of the bit line circuit 250_1.

At this time, the connection signal BISH inputted to the auxiliary precharging unit 250_1 is supplied to the bit line circuit disposed between two cell arrays, and the equalization signal BLEQ is supplied to the bit line circuit 250_1.

Accordingly, the MOS transistors N7, N6 and N1 of the auxiliary precharging unit 250_1 are turned on only when the bit line circuit 250_1 performs the precharge operation. Therefore, an auxiliary operation is performed when the bit lines BL and /BL of the bit line circuit 250_1 are precharged.

In accordance with the semiconductor memory device of the present invention, it takes the same time or a rather shorter time to perform the precharge operation in the bit line circuit disposed at the edge portion, compared with the bit line circuit disposed between the cell arrays. Accordingly, the semiconductor memory device of the present invention solves a drawback in that it takes a longer time to perform the precharge operation of the bit line circuit disposed at the edge portion, thereby causing the reduction of the operation speed.

Therefore, a time taken to access data through the sense amplifier of the bit line circuit disposed between the cell arrays, or a time taken to access the sense amplifier of the bit line circuit disposed at the edge is not increased.

Figure 7B:
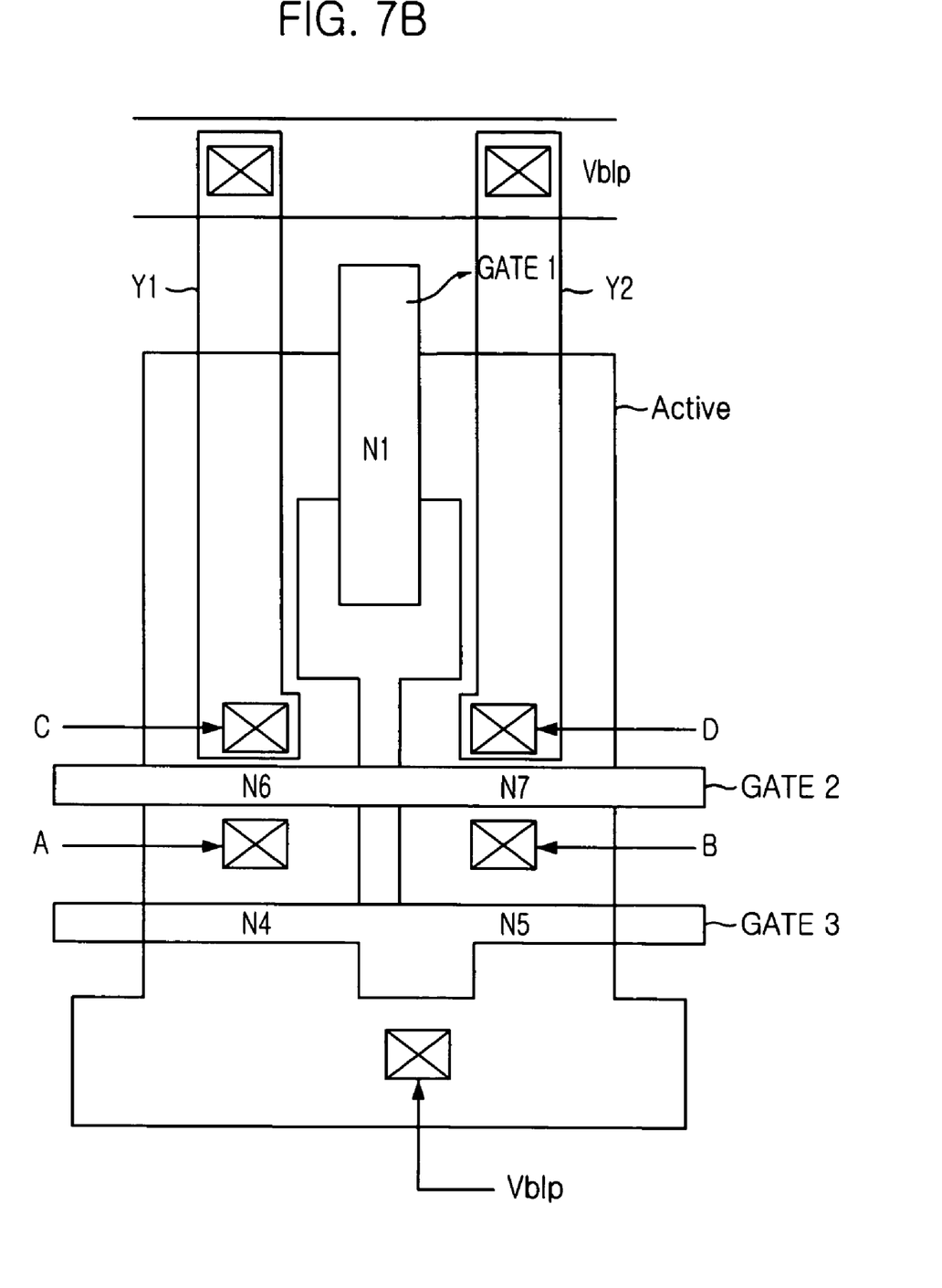
FIG. 7B is a layout illustrating a portion of a sense amplifier of FIG. 7A.

FIG. 7B is a layout illustrating a portion of the sense amplifier of FIG. 7A. The nodes A, B, C and D of the FIG. 7B are the same part as the nodes of FIG. 7A. Specifically, the nodes represent the MOS transistors N1, N4, N5, N6 and N7, respectively.

Referring to FIG. 7B, it can be understood that the precharge voltage Vblp is supplied to the nodes C and D, in addition to the one terminal of the MOS transistors N4 and N5.

In the semiconductor memory device having the shared bit line sense amplifier structure in accordance with the present invention, all of the bit line sense amplifiers can have the same precharge capability. Further, even in case where data is accessed through the bit line sense amplifier of the bit line circuit disposed at the edge portion of the cell region, a data access time is not increased, thereby providing more reliable data access.

The present application contains subject matter related to Korean patent applications No. 2003-31926, filed in the Korean Patent Office on May 6, 2003, the entire contents of which being incorporated herein by reference.

While the present invention has been described with respect to the particular embodiments, it will be apparent to those skilled in the art that various changes and modifications may be made without departing from the scope of the invention as defined in the following claims.

What is claimed is:

1. A semiconductor memory device having a shared bit line sense amplifier structure, the semiconductor memory device comprising:

a plurality of cell arrays each of which has a plurality of bit line pairs, the cell arrays including a first cell array disposed at an edge portion of a cell region and a second cell array disposed adjacent to the first cell array;

a first precharging unit for precharging some bit line pairs of the first or second cell array;

a second precharging unit for precharging the other bit line pairs of the first cell array; and an auxiliary precharging unit for assisting a precharge operation of the second precharging unit, wherein the auxiliary precharging unit includes:

an auxiliary-precharging MOS transistor for connecting the bit line pairs with one another in response to an equalization signal;

first and second MOS transistors for connecting one terminal and the other terminal of the auxiliary-precharging MOS transistor with the second precharging unit, respectively; and first and second connecting wires for connecting a drain and a source of the first and second transistors.

2. The semiconductor memory device as recited in claim 1, wherein the auxiliary precharging unit includes:

an auxiliary-precharging MOS transistor for connecting the bit line pairs with one another in response to an equalization signal; and first and second MOS transistors for connecting one terminal and the other terminal of the auxiliary-precharging MOS transistor with the second precharging unit in response to a connection signal, respectively, wherein a precharge voltage is supplied to the one terminal and the other terminal of the auxiliary-precharging MOS transistor.

3. The semiconductor memory device as recited in claim 1, further comprising:

a first connecting unit for connecting the first precharging unit with the first cell array; and a second connecting unit for connecting the first precharging unit with the second cell array.

4. The semiconductor memory device as recited in claim 3, further comprising a bit line sense amplifier, disposed between the first connecting unit and the second connecting unit, for sensing and amplifying a data signal applied on the bit line pair.

5. A semiconductor memory device having a shared bit line sense amplifier, the semi conductor memory device comprising:

a first cell array disposed at an edge portion among a plurality of cell arrays, each of which has a plurality of bit line pairs;

a second cell array disposed adjacent to the first cell array;

a first bit line circuit for precharging some bit line pairs of the first or second cell array or sensing and amplifying an applied data signal; and a second bit line circuit for sensing and amplifying data applied on the other bit line pairs of the first cell array or precharging the bit line pairs, wherein the second bit line circuit comprises:

a first equalization unit for electrically connecting a first bit line pair of the first cell array in response to an equalization signal;

a bit line sense amplifier for sensing and amplifying a data signal applied on the first bit line pair;

a precharging unit for precharging the first bit line pair;

a first connecting unit for connecting the first equalization unit with the bit line sense amplifier;

a second equalization unit for electrically connecting the first bit line pair with each other in response to the equalization signal; and a second connecting unit for connecting the second equalization unit with the precharging unit, the second connecting unit being maintained in an enabled state.

6. A semiconductor memory device having a shared bit line sense amplifier, the semiconductor memory device comprising:

a first cell array disposed at an edge portion among a plurality of cell arrays, each of which has a plurality of bit line pairs;

a second cell array disposed adjacent to the first cell array;

a first bit line circuit for precharging some bit line pairs of the first or second cell array or sensing and amplifying an applied data signal; and a second bit line circuit for sensing and amplifying data applied on the other bit line pairs of the first cell array or precharging the bit line pairs, wherein the second bit line circuit comprises:

a first equalization unit for electrically connecting a first bit line pair of the first cell array in response to an equalization signal;

a bit line sense amplifier for sensing and amplifying a data signal applied on the first bit line pair;

a precharging unit for precharging the first bit line pair to a precharge voltage;

a first connecting unit for connecting the first equalization unit with the bit line sense amplifier;

a second equalization unit for electrically connecting the first bit line pair with each other in response to the equalization signal;

a second connecting unit for connecting the second equalization unit with the precharging unit; and a metal wire for connecting the second equalization unit with the precharge unit regardless of an enabling of the second connecting unit.

* * * * *